US011107863B2

(12) United States Patent
Lim et al.

(10) Patent No.: US 11,107,863 B2
(45) Date of Patent: Aug. 31, 2021

(54) ORGANIC LIGHT-EMITTING DISPLAY DEVICE WITH COLOR ADJUSTING PATTERN, AND METHOD OF MANUFACTURING THE SAME

(71) Applicant: Samsung Display Co., Ltd., Yongin-si (KR)

(72) Inventors: Jaeik Lim, Hwaseong-si (KR); Woongsik Kim, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/196,351

(22) Filed: Nov. 20, 2018

(65) Prior Publication Data

US 2019/0206944 A1 Jul. 4, 2019

(30) Foreign Application Priority Data

Dec. 28, 2017 (KR) .......................... 10-2017-0181832

(51) Int. Cl.
| | |
|---|---|
| *H01L 29/08* | (2006.01) |
| *H01L 27/32* | (2006.01) |
| *H01L 51/52* | (2006.01) |
| *H01L 51/56* | (2006.01) |

(52) U.S. Cl.
CPC ........ *H01L 27/322* (2013.01); *H01L 51/5253* (2013.01); *H01L 51/56* (2013.01); *H01L 27/3244* (2013.01); *H01L 2251/303* (2013.01)

(58) Field of Classification Search
CPC .......................... H01L 27/322; H01L 51/5253
USPC ........................................................ 257/40
See application file for complete search history.

(56) References Cited

U.S. PATENT DOCUMENTS

| | | | | |
|---|---|---|---|---|
| 7,744,714 B2 * | 6/2010 | Akimoto | .............. | H05K 3/1258 |
| | | | | 156/236 |
| 8,882,299 B2 * | 11/2014 | Kinomoto | ............. | H01L 27/322 |
| | | | | 362/293 |
| 8,963,138 B2 * | 2/2015 | Lim | .................... | H01L 51/5275 |
| | | | | 257/40 |
| 9,064,450 B2 * | 6/2015 | Kashiwabara | ...... | H01L 27/3213 |
| 9,219,087 B2 * | 12/2015 | Jinta | ................... | H01L 27/1259 |
| 10,115,358 B2 * | 10/2018 | Lee | ....................... | G09G 3/3648 |
| 10,385,268 B2 * | 8/2019 | Lee | .......................... | G02B 1/04 |

(Continued)

FOREIGN PATENT DOCUMENTS

| | | |
|---|---|---|
| KR | 10-2009-0037432 A | 4/2009 |
| KR | 10-2016-0031108 A | 3/2016 |

(Continued)

OTHER PUBLICATIONS

The extended European Search Report for European Patent Application No. 18248221.6 dated May 28, 2019.

*Primary Examiner* — Caleb E Henry

(74) *Attorney, Agent, or Firm* — Kile Park Reed & Houtteman PLLC

(57) ABSTRACT

An organic light-emitting display device includes a thin film encapsulation layer, a transmission pattern, and a color-adjusting pattern. The thin film encapsulation layer covers an organic light-emitting diode. The transmission pattern is in a light-emitting area on the thin film encapsulation layer. The color-adjusting pattern includes ceramic particles as a coloring agent and is in a non-light-emitting area surrounding the light-emitting area on the thin film encapsulation layer.

11 Claims, 9 Drawing Sheets

(56) References Cited

U.S. PATENT DOCUMENTS

| | | | | |
|---|---|---|---|---|
| 10,481,423 B2* | 11/2019 | Song | | G06F 1/1652 |
| 2002/0163108 A1* | 11/2002 | Oshio | | H01J 9/02 |
| | | | | 264/614 |
| 2009/0161341 A1* | 6/2009 | Meir | | G02B 6/0041 |
| | | | | 362/84 |
| 2009/0195730 A1* | 8/2009 | Park | | G02F 1/133609 |
| | | | | 349/71 |
| 2009/0262290 A1* | 10/2009 | Sampica | | B32B 17/10018 |
| | | | | 349/122 |
| 2010/0001648 A1* | 1/2010 | De Clercq | | H05B 33/0821 |
| | | | | 315/113 |
| 2010/0035503 A1* | 2/2010 | Kim | | C03C 8/24 |
| | | | | 445/25 |
| 2010/0110675 A1* | 5/2010 | Van Herpen | | B32B 17/10036 |
| | | | | 362/234 |
| 2010/0207065 A1* | 8/2010 | Miyagawa | | C09K 11/7774 |
| | | | | 252/301.4 R |
| 2011/0043921 A1* | 2/2011 | Kashiwagi | | B29D 11/0074 |
| | | | | 359/614 |
| 2011/0269364 A1* | 11/2011 | Yoon | | G02B 5/201 |
| | | | | 445/24 |
| 2012/0170303 A1* | 7/2012 | Meir | | G02B 6/0021 |
| | | | | 362/555 |
| 2012/0182714 A1* | 7/2012 | Kwon | | G02B 5/02 |
| | | | | 362/84 |
| 2013/0120678 A1* | 5/2013 | Chao | | G02F 1/01 |
| | | | | 349/34 |
| 2014/0175492 A1* | 6/2014 | Steranka | | H01L 33/50 |
| | | | | 257/98 |
| 2014/0329180 A1* | 11/2014 | Lee | | G03F 7/0042 |
| | | | | 430/319 |
| 2015/0318447 A1* | 11/2015 | Choi | | H01L 27/322 |
| | | | | 257/98 |
| 2016/0370646 A1* | 12/2016 | Nishiyama | | G03F 7/11 |
| 2018/0081217 A1* | 3/2018 | Kim | | G02F 1/133345 |

FOREIGN PATENT DOCUMENTS

| | | |
|---|---|---|
| KR | 10-2016-0117728 A | 10/2016 |
| KR | 10-2017-0026885 A | 3/2017 |
| WO | WO 2015/196645 A1 | 12/2015 |

* cited by examiner

FIG. 4
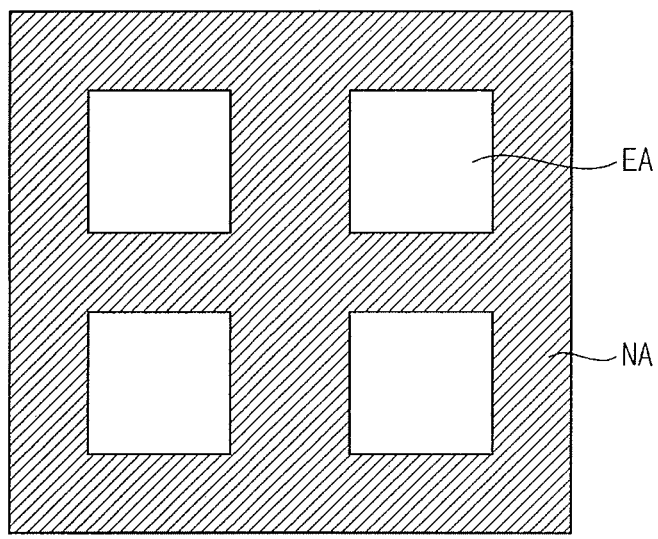
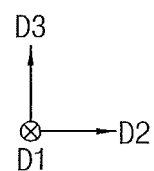

ORGANIC LIGHT-EMITTING DISPLAY DEVICE WITH COLOR ADJUSTING PATTERN, AND METHOD OF MANUFACTURING THE SAME

CROSS-REFERENCE TO RELATED APPLICATION

Korean Patent Application No. 10-2017-0181832 filed on Dec. 28, 2017 in the Korean Intellectual Property Office, and entitled: "Organic Light-Emitting Display Device and Method of Manufacturing the Same," is incorporated by reference herein in its entirety.

BACKGROUND

1. Field

Exemplary embodiments relate to a display device. More particularly, exemplary embodiments relate to an organic light-emitting display device and a method of manufacturing an organic light-emitting display device.

2. Description of the Related Art

When a display device is used for a television, a computer monitor, a mobile phone, or the like, visibility of the display is paramount. However, as display devices are being incorporated into non-display items, e.g., a home appliance, furniture, or the like, visibility may not be desired at all times and may be distracting.

SUMMARY

According to an exemplary embodiment, an organic light-emitting display device includes a thin film encapsulation layer, a transmission pattern and a color-adjusting pattern. The thin film encapsulation layer covers an organic light-emitting diode. The transmission pattern is in a light-emitting area on the thin film encapsulation layer. The color-adjusting pattern includes ceramic particles as a coloring agent and is in a non-light-emitting area surrounding the light-emitting area on the thin film encapsulation layer.

In an exemplary embodiment, the transmission pattern includes a polymeric resin.

In an exemplary embodiment, the ceramic particles include at least one selected from the group consisting of $Pb_2Sb_2O_7$, $Co_2SiO_4$, $CoAl_2O_4$, $(Co, Ni, Fe, Cr, Mn)_3O_4$, $(Sn, Cr)O_2$, $(Cr, Al)_2O_3$, $Ca_3Cr_2Si_3O_{12}$, $Ca(Sn, Cr)SiO_5$, $Cd(S, Se)$, $(Ti, Cr, Sb)O_2$, $(Ti, Cr, W)O_2$, $(Zr, Pr)SiO_4$, $(Zr, V)(Si, V)O_4$, $F_2O_3$—$Zr\ SiO_4$, $(Zr, V)O_2$, $(Ce, Pr)O_2$ and $Y(Al, Cr)O_2$.

In an exemplary embodiment, the organic light-emitting display device is inserted into an external member and the color-adjusting pattern has a same color as an exposed surface of the external member.

In an exemplary embodiment, the transmission pattern includes a color filter.

In an exemplary embodiment, the color filter has a same color as a light generated by the organic light-emitting diode.

In an exemplary embodiment, the transmission pattern includes a first color filter disposed in a first light-emitting area, and a second color filter in a second light-emitting area. The first color filter and second color filter may have different colors from each other.

In an exemplary embodiment, the transmission pattern further includes a dye or a carbon black to reduce a reflectivity.

In an exemplary embodiment, the transmission pattern has a same reflectivity as the color-adjusting pattern.

In an exemplary embodiment, the color-adjusting pattern has a tapered shape, and the transmission pattern has an inversely-tapered pattern to be aligned with the color-adjusting pattern.

In an exemplary embodiment, an area of the color-adjusting pattern is larger than an area of the transmission pattern in a plan view.

According to an exemplary embodiment, a method of manufacturing an organic light-emitting display device is provided. According to the method, a transmission pattern is formed on a thin film encapsulation layer covering an organic light-emitting diode thereby defining an opening area where the thin film encapsulation is exposed. A color-adjusting pattern is formed in the opening adjacent to the transmission pattern. The color-adjusting pattern includes ceramic particles as a coloring agent.

According to exemplary embodiments, an organic light-emitting display device includes a color-adjusting pattern disposed on a non-light-emitting area. The color-adjusting pattern may have various colors and reflective properties through combination and content adjustment of ceramic particles. Thus, when combined with other articles, the organic light-emitting display device may be designed to have a color harmonious with a color of the articles.

Furthermore, the color-adjusting pattern including the ceramic articles may function as an encapsulation layer to protect a light-emitting element.

Furthermore, the organic light-emitting display device includes a transmission pattern disposed in a light-emitting area to prevent reduction of visibility of a displayed image.

Furthermore, after the transmission pattern is formed, the color-adjusting pattern may be formed through a liquid process such as inkjet printing with using the transmission pattern as a guide wall. Thus, damage to the light-emitting element due to heat may be prevented.

BRIEF DESCRIPTION OF THE DRAWINGS

Features will become apparent to those of skill in the art by describing in detail exemplary embodiments with reference to the attached drawings in which:

FIG. 4 illustrates a partial plan view partially of an organic light-emitting display device according to an exemplary embodiment.

DETAILED DESCRIPTION

Figure 1:
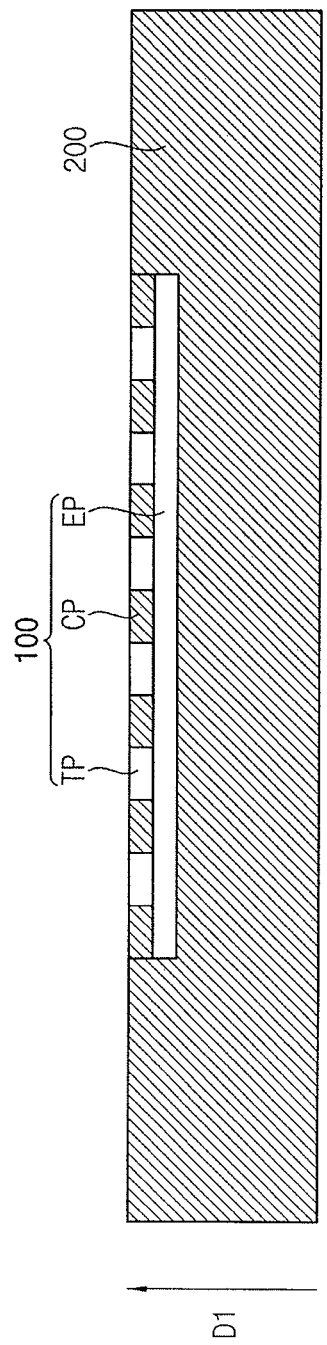
FIG. 1 illustrates a cross-sectional view of an organic light-emitting display device according to an exemplary embodiment and an external member combined therewith.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

An organic light-emitting display device and a method of manufacturing an organic light-emitting display device according to exemplary embodiments will be described hereinafter with reference to the accompanying drawings, in which some exemplary embodiments are shown. Same or similar reference numerals may be used for same or similar elements in the drawings.

FIG. 1 is a cross-sectional view illustrating an organic light-emitting display device according to an exemplary embodiment and an external member combined therewith. Referring to FIG. 1, an organic light-emitting display device 100 may be combined with an external member 200 along a first direction D1, e.g., a viewing direction. For example, the organic light-emitting display device 100 may be inserted into the external member 200 such that an upper surface of the external member 200 and an upper surface of the organic light-emitting display device 100 form a substantially continuous surface, e.g., are coplanar along second and third directions D2, D3, crossing the first direction D1. Thus, an exposed surface of the organic light-emitting display device 100 may be surrounded by the external member 200 in a plan view, e.g., in the D2-D3 plane.

The external member 200 may be a non-display device, such as a home appliance e.g., a refrigerator, a washing machine, a toaster, a wireless kettle, an oven, or the like, or furniture, e.g., storage furniture, a showcase, a closet, a table, or the like. The external member may be various articles, to which a displaying function may be applied, but which is not primarily a display device.

As noted above, when displays are incorporated into a non-display external member, visibility is not always desired. In particular, when the external member has a decorative function, when the display device is not in use, in accordance with embodiments set forth below, the visibility of the display device may be reduced to maintain the aesthetic sensibility of the external member. In particular, when not in use, the display device according to embodiments may blend into the external member to minimize the appearance of the display device.

The organic light-emitting display device 100 includes a light-emitting part EP. The light-emitting part EP generates light to display an image. A transmission pattern TP and a color-adjusting pattern CP are on the light-emitting part EP. The transmission pattern TP and the color-adjusting pattern CP may be in a same layer.

The transmission pattern TP may transmit light. Thus, light generated by the light-emitting part EP may exit through the transmission pattern TP outwardly along the first direction D1. Thus, an external user may perceive an image displayed by the organic light-emitting display device 100. The transmission pattern TP may include a polymeric resin, e.g., an acrylic resin, a phenolic resin, or a cured product thereof.

The color-adjusting pattern CP may an opaque member having a relatively low light-transmittance. In an exemplary embodiment, the color-adjusting pattern CP may have a substantially same color as the surface of the external member 200. Thus, when the organic light-emitting display device 100 does not generate an image, the organic light-emitting display device 100 may be perceived as a portion of the external member 200, or may otherwise have a low visibility. Thus, displaying function may be introduced into the external member 200 without deteriorating aesthetic sensibility or decorative function of the external member 200.

Figure 2:
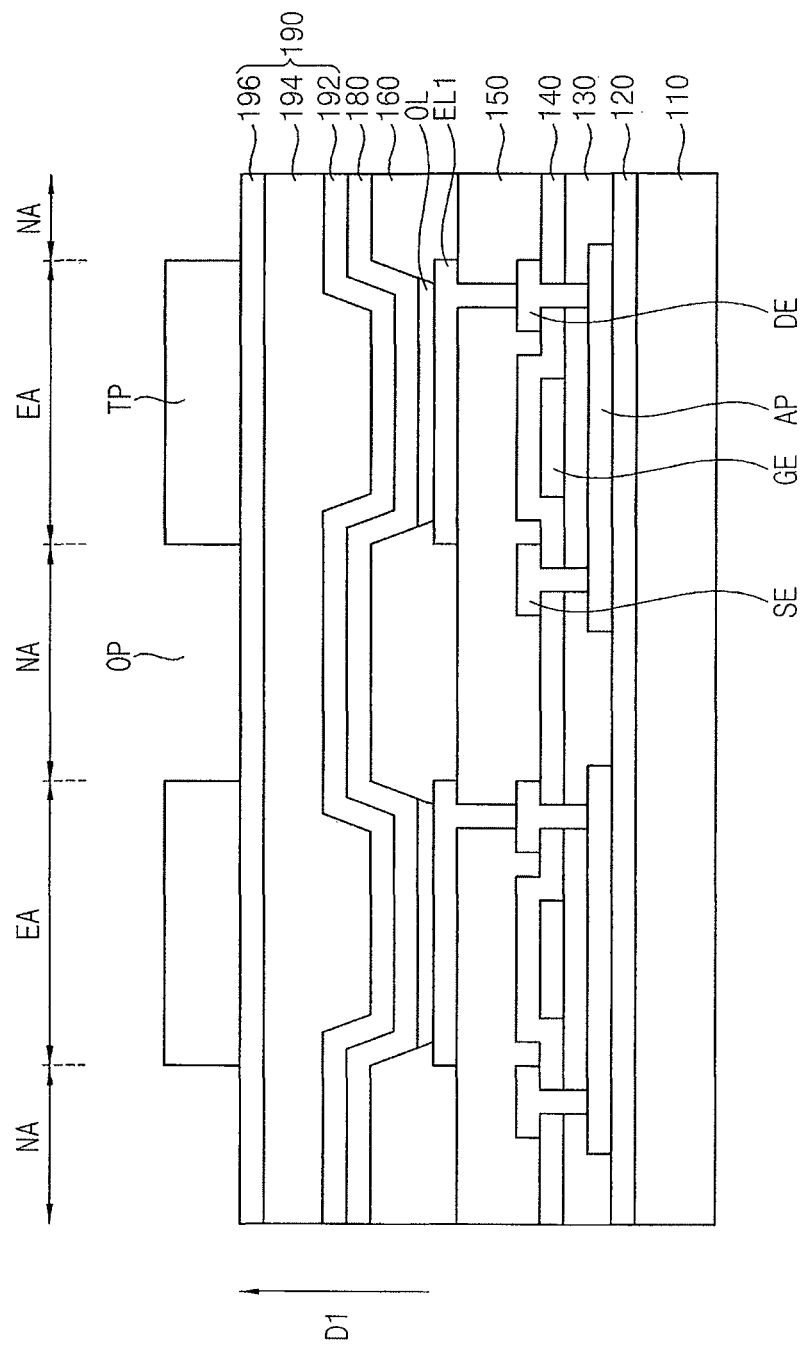
FIGS. 2 and 3 illustrate cross-sectional views of an organic light-emitting display device according to an exemplary embodiment.
Figure 3:
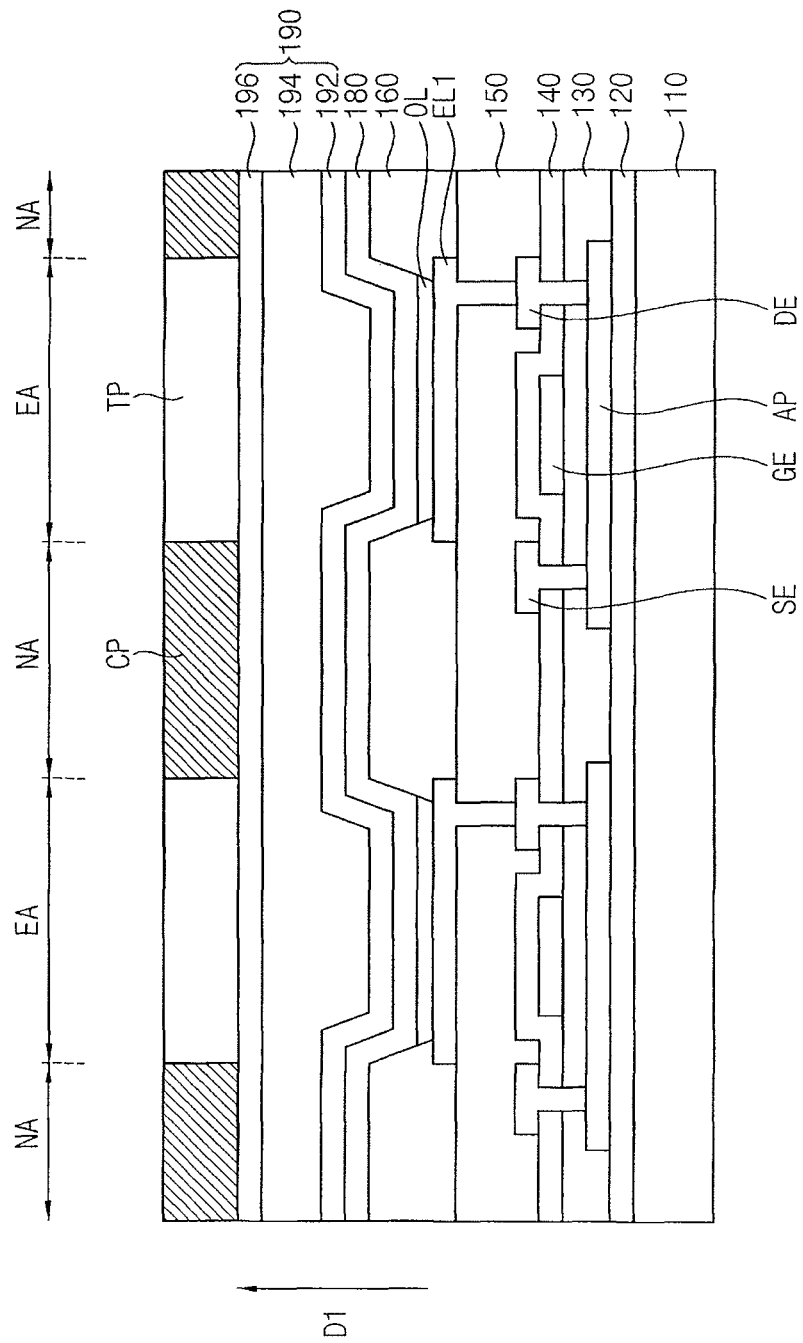

FIGS. 2 and 3 are cross-sectional views illustrating an organic light-emitting display device according to an exemplary embodiment. FIG. 4 is a plan view partially illustrating an organic light-emitting display device according to an exemplary embodiment.

Referring to FIG. 2, a transmission pattern TP is formed on a thin film encapsulation layer covering an organic light-emitting diode electrically connected to a pixel circuit array. The pixel circuit array, the organic light-emitting diode and the thin film encapsulation layer may be formed through a known method.

In an exemplary embodiment, the pixel circuit array is on a base substrate 110. The pixel circuit array may include an active pattern AP, a gate electrode GE, a source electrode SE, a drain electrode DE, and insulation layers covering the active pattern AP, the gate electrode GE, the source electrode SE and the drain electrode DE.

For example, the base substrate 110 may include glass, quartz, silicon, a polymer, or the like. For example, the polymer may include polyethylene terephthalate, polyethylene naphthalate, polyether ketone, polycarbonate, polyarylate, polyether sulfone, polyimide, any combination thereof, or the like. When the base substrate 110 is a flexible substrate including polyimide or the like, the base substrate 110 may include a polymer substrate and may be combined with a carrier substrate during manufacture. The carrier substrate may include a glass substrate or the like, and may be removed after the pixel circuit array, the organic light-emitting diode and the thin film encapsulation layer are formed.

A buffer layer 120 may be on the base substrate 110. The buffer layer 120 may prevent or reduce penetration of impurities, humidity, or external gas from underneath of the base substrate 110, and may planarize an upper surface of the base substrate 110. For example, the buffer layer 120 may include an inorganic material, e.g., oxide, nitride, carbide, or the like.

The active pattern AP may be on the buffer layer 120. The active pattern AP may overlap the gate electrode GE along the first direction D1. For example, the active pattern AP may include a semiconductor material, e.g., amorphous silicon, polycrystalline silicon (polysilicon), oxide semiconductor, or the like. For example, when the active pattern AP includes polysilicon, at least a portion of the active pattern AP may be doped with impurities, e.g., n-type impurities or p-type impurities.

A first insulation layer 130 may be on the active pattern AP. For example, the first insulation layer 130 may include silicon oxide, silicon nitride, silicon carbide, any combination thereof, or the like. Furthermore, the first insulation layer 130 may include an insulating metal oxide, e.g., aluminum oxide, tantalum oxide, hafnium oxide, zirconium oxide, titanium oxide, or the like. For example, the first insulation layer 130 may have a single-layer structure or a multiple-layer structure including silicon nitride and/or silicon oxide.

The gate electrode GE may be on the first insulation layer 130. For example, the gate electrode GE may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta), alloys thereof, or the like. The gate electrode GE may have a single-layer structure or a multiple-layer structure including different metal layers.

A second insulation layer 140 may be on the gate electrode GE and the first insulation layer 130. For example, the second insulation layer 140 may include silicon oxide, silicon nitride, silicon carbide, any combination thereof, or the like. Furthermore, the second insulation layer 140 may include an insulating metal oxide, e.g., aluminum oxide, tantalum oxide, hafnium oxide, zirconium oxide, titanium oxide, or the like.

A data metal pattern including the source electrode SE and the drain electrode DE may be on the second insulation layer 140. The source electrode SE and the drain electrode DE may extend through the first insulation layer 130 and the second insulation layer 140. e.g., along the first direction D1, to contact the active pattern AP. respectively, e.g., at opposite ends thereof along a direction crossing the first direction D1. For example, the source electrode SE and the drain electrode DE may be any of the materials noted above for the gate electrode GE, and may have a single-layer structure or a multiple-layer structure including different metal layers. The materials and/or structure of the source electrode SE, the drain electrode DE, and the gate electrode GE may be the same as or different from one another.

A third insulation layer 150 may be disposed on the data metal pattern and the second insulation layer 140. For example, the third insulation layer 150 may include an inorganic insulation material, an organic insulation material or a combination thereof. For example, the organic insulation material may include polyimide, polyamide, acrylic resin, phenol resin, benzocyclobutene (BCB) or the like.

A first electrode EL1 of the organic light-emitting diode may be on the third insulation layer 150. In an exemplary embodiment, the first electrode EL1 may function as an anode. For example, the first electrode EL1 may be a transmitting electrode or a reflecting electrode according to an emission type of the display device. When the first electrode EL1 is a transmitting electrode, the first electrode EL1 may include indium tin oxide, indium zinc oxide, zinc tin oxide, indium oxide, zinc oxide, tin oxide or the like. When the first electrode EL1 is a reflecting electrode, the first electrode EL1 may include Au, Ag, Al, Cu, Ni, Pt, Mg, Cr, W, Mo, Ti, any combination thereof, or the like, and may have a stack structure further including a material that may be used for the transmitting electrode.

A pixel-defining layer 160 may be on the third insulation layer 150. The pixel-defining layer 160 may include an opening that exposes at least a portion of the first electrode EL1. For example, the pixel-defining layer 160 may include an organic insulation material. For example, the pixel-defining layer 160 and the third insulation layer 150 may be formed by coating a photoresist composition including an organic insulation material and patterning a coating layer using exposure-development processes.

An organic light-emitting layer OL may be on the first electrode EL1. A common layer 180 may be on the organic light-emitting layer OL. The common layer 180 may include at least one layer extending continuously across a plurality of pixels in a display area.

In an exemplary embodiment, the organic light-emitting layer OL may have a pattern shape in an opening of the pixel-defining layer 160. Alternatively, one or more layers of the organic light-emitting layer OL may continuously extend across a plurality of pixels in the display area like the common layer 180.

For example, the organic light-emitting layer OL may include at least one of a hole injection layer (HIL), a hole transporting layer (HTL), a light-emitting layer, an electron transporting layer (ETL) and an electron injection layer (EIL). At least one layer of the organic light-emitting layer OL may continuously extend across a plurality of pixels in the display area like the common layer 180. For example, the organic light-emitting layer 182 may include a low molecular weight organic compound or a high molecular weight organic compound.

In an exemplary embodiment, the organic light-emitting layer OL may emit red, green, or blue light. In another exemplary embodiment, the organic light-emitting layer OL may emit white light. The organic light-emitting layer OL emitting white light may have a multiple-layer structure including a red-emitting layer, a green-emitting layer and a blue-emitting layer, or a single-layer structure including a mixture of a red-emitting material, a green-emitting material, and a blue-emitting material.

The common layer 180 may include at least a second electrode, and may further include a capping layer and/or a blocking layer on the second electrode. In an exemplary embodiment, the second electrode may function as a cathode. For example, the second electrode may be formed as a transmitting electrode or a reflecting electrode according to an emission type of the display device. For example, when the second electrode is a transmitting electrode, the second electrode may include lithium (Li), calcium (Ca), lithium fluoride (LiF), aluminum (Al), magnesium (Mg), any combination thereof, or the like, and the display device may further include a sub electrode or a bus electrode line, which includes indium tin oxide, indium zinc oxide, zinc tin oxide, indium oxide, zinc oxide, tin oxide, or the like.

The capping layer may be on the second electrode. The capping layer may protect the organic light-emitting diode and may promote the light generated by the organic light-emitting diode to exit outwardly.

For example, the capping layer may include an inorganic material or an organic material. For example, the inorganic material may include zinc oxide, tantalum oxide, zirconium oxide, titanium oxide or the like. For example, the organic material may include poly(3,4-ethylenedioxythiophene), PEDOT), 4,4'-bis[N-(3-methylphenyl)-N-phenylamino]biphenyl (TPD), 4,4',4"-tris[(3-methylphenyl)phenylamino] triphenylamine (m-MTDATA), 1,3,5-tris[N,N-bis(2-methylphenyl)-amino]-benzene (o-MTDAB), 1,3,5-tris[N,N-bis (3-methylphenyl)-amino]-benzene (m-MTDAB), or the like.

The blocking layer may be on the capping layer. The blocking layer may prevent damage to the organic light-emitting diode by plasma or the like from later processes in making the display device. For example, the blocking layer may include lithium fluoride, magnesium fluoride, calcium fluoride, or the like.

The thin film encapsulation layer 190 may be on the common layer 180. The thin film encapsulation layer 190 may have a stack structure of an inorganic layer and an organic layer. For example, the thin film encapsulation layer 190 may include a first inorganic layer 192, a second inorganic layer 196, and an organic layer 194 between the first and second inorganic layers 192 and 196.

For example, the organic layer 194 may include a cured resin, e.g., poly(meth)acrylate or the like. For example, the cured resin may be formed from cross-linking reaction of monomers. For example, the first and second inorganic layers 192 and 196 may include an inorganic material, e.g., silicon oxide, silicon nitride, silicon carbide, aluminum oxide, tantalum oxide, hafnium oxide, zirconium oxide, titanium oxide, or the like. The first and second inorganic layers 192 and 196 may be formed through chemical vaporization deposition (CVD).

The organic layer 194 may be formed on the first inorganic layer 192. For example, a monomer composition may be provided on an upper surface of the first inorganic layer 192 to form the organic layer 194. The monomer composition may include a curable monomer. For example, the curable monomer may contain at least one curable functional group. For example, the curable functional group may include a vinyl group, a (meth)acrylate group, an epoxy group or the like.

For example, the curable monomer may include ethyleneglycol di(meth)acrylate, hexanediol di(meth)acrylate, heptanediol di(meth)acrylate, octanediol di(meth)acrylate, nonanediol di(meth)acrylate, decanediol di(meth)acrylate, triethylpropane tri(meth)acrylate, pentaerythritol tri(meth)acrylate, pentaerythritol tetra(meth)acrylate, dipentaerythritol tri(meth)acrylate, di pentaerythritol tetra(meth)acrylate, dipentaerythritol penta(meth)acrylate, dipentaerythritol hexa(meth)acrylate, or the like. The monomer composition may further include an initiator such as a photo initiator or the like.

The monomer composition may be provided on the first inorganic layer 192 by an inkjet printing method, a screen printing method or the like. The monomer composition may be cured through a following process to form a cured resin.

The thin film encapsulation layer 190 herein includes two inorganic layers and one organic layer. Alternatively, the thin film encapsulation layer 190 may include at least two organic layers, or at least three inorganic layers.

The transmission pattern TP may cover a light-emitting area EA. The light-emitting area EA may be defined as an area in which a light is generated and transmitted. For example, the light-emitting area EA may be defined as an area overlapping the opening of the pixel-defining layer 160 or the organic-light emitting layer OL along the first direction D1. In the organic light-emitting display device, a remaining area excluding the light-emitting area EA may define a non-light-emitting area NA. For example, as illustrated in FIG. 4, the light-emitting area EA may have an island shape, and the non-light-emitting area NA may have a matrix shape surrounding the light-emitting area EA, in a plan view.

In an exemplary embodiment, the non-light-emitting area NA overlapping the color-adjusting pattern CP may have an area larger than the light-emitting area EA overlapping the transmission pattern TP.

An area in which the transmission pattern TP is not disposed may define an opening area OP corresponding to the non-light-emitting area NA. Thus, an upper surface of the thin film encapsulation layer 190 may be exposed through the opening area OP.

In an exemplary embodiment, a photoresist composition may be coated on the thin film encapsulation layer 190 to form a coating layer, and the coating layer may be exposed to a light and developed to form the transmission pattern TP.

The photoresist composition may be a positive type or a negative type. The photoresist composition may be curable at a relatively low temperature, such that the organic light-emitting diode and other elements may be protected from damage or deformation due to heat.

In an exemplary embodiment, the transmission pattern TP may further include a light property-adjusting agent so that the transmission pattern TP may have a similar light property as the color-adjusting pattern CP. For example, the transmission pattern TP may be designed to have a substantially same reflectivity as the color-adjusting pattern CP. For example, the transmission pattern TP may further include a light-blocking material or a light-absorbing material such as a dye or carbon black.

Referring to FIG. 3, the color-adjusting pattern CP is formed in the opening area OP adjacent to the transmission pattern TP. The color-adjusting pattern CP may cover the non-light-emitting area NA. Thus, the color-adjusting pattern CP may have a shape surrounding the transmission pattern TP.

The color-adjusting pattern CP may include ceramic particles as a coloring agent. The ceramic particles may be selected variously according to the desired color. For example, the ceramic particles may include $Pb_2Sb_2O_7$ (yellow), $Co_2SiO_4$ (blue), $CoAl_2O_4$ (blue), (Co, Ni, Fe, Cr, Mn)$_3O_4$ (black), (Sn, Cr)$O_2$ (pink), (Cr, Al)$_2O_3$ (green), $Ca_3Cr_2 Si_3O_{12}$ (green), Ca(Sn, Cr)SiO$_5$ (burgundy), Cd(S, Se) (orange-red), (Ti, Cr, Sb)$O_2$ (orange), (Ti, Cr, W)$O_2$ (tobacco), (Zr, Pr)SiO$_4$ (yellow), (Zr, V)(Si, V)$O_4$ (turquoise), $F_2O_3$—Zr SiO$_4$ (red), (Zr, V)$O_2$ (yellow), (Ce, Pr)$O_2$ (red), Y(Al, Cr)$O_2$ (red) or the like. These may be each alone on in combination.

For example, a coloring composition including the ceramic particles may be provided in the opening area OP through inkjet printing or the like. Thereafter, the coloring composition is dried and/or cured to form the color-adjusting pattern CP.

In an exemplary embodiment, before the color-adjusting pattern CP is formed, a surface of the transmission pattern TP may be treated to be hydrophobic. When the surface of the transmission pattern TP is hydrophobic and the coloring composition is hydrophilic, the coloring composition may be prevented from flowing over the transmission pattern TP. Thus, an area of the transmission pattern TP may be maintained, and light-emitting efficiency may be maintained. For example, a plasma from a fluorine-containing source may be provided to the transmission pattern TP for hydrophobic surface treatment.

A protective member, e.g., a protective window or a protective film, may be provided on the transmission pattern TP and the color-adjusting pattern CP.

In an exemplary embodiment, an organic light-emitting display device includes a color-adjusting pattern on a non-light-emitting area. The color-adjusting pattern may have various colors and reflective properties through combination and content adjustment of ceramic particles. Thus, when combined with other articles, the organic light-emitting display device may be designed to have a color harmonious with a color of the articles.

Furthermore, the color-adjusting pattern including the ceramic articles may function as an encapsulation layer to protect a light-emitting element. Furthermore, the organic light-emitting display device includes a transmission pattern in a light-emitting area to prevent reduction of visibility of a displayed image.

Furthermore, after the transmission pattern is formed, the color-adjusting pattern may be formed through a liquid process, e.g., inkjet printing, using the transmission pattern as a guide. Thus, damage to the light-emitting element due to heat may be prevented.

Figure 5:
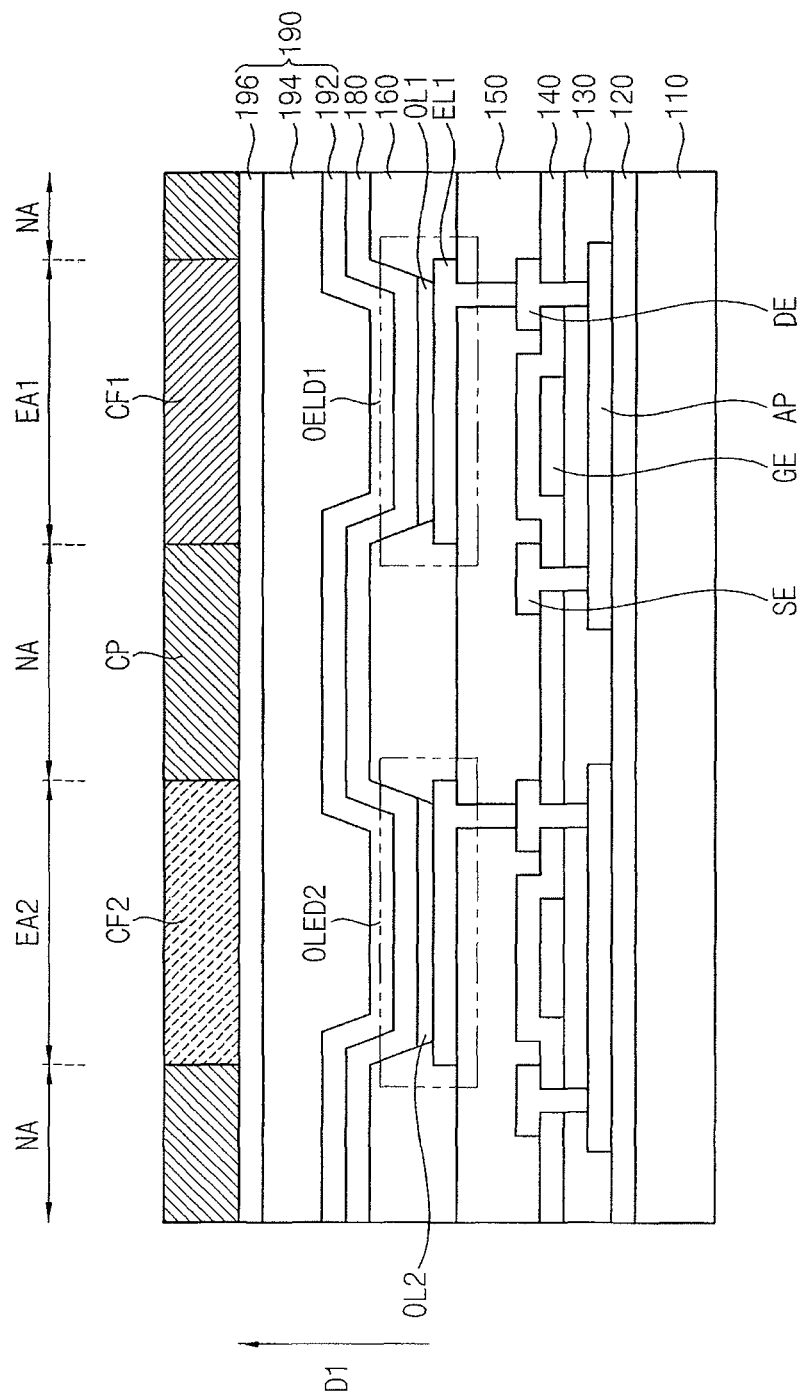
FIG. 5 illustrates an enlarged cross-sectional view of an organic light-emitting display device according to an exemplary embodiment.

FIG. 5 is an enlarged cross-sectional view illustrating an organic light-emitting display device according to an exemplary embodiment. Referring to FIG. 5, an organic light-emitting display device includes a pixel circuit array, an organic light-emitting diode electrically connected to the pixel circuit array, a thin film encapsulation layer 190 covering the organic light-emitting diode, color filters CF1 and CF2 in a light-emitting area EA1 and EA2 on the thin film encapsulation layer 190, and a color-adjusting pattern CP disposed in a non-light-emitting area NA on the thin film encapsulation layer 190. The organic light-emitting display device may have a substantially same configuration as the organic light-emitting display device illustrated in FIG. 3 except for including the color filters CF1 and CF2 instead of the transmission pattern TP. Thus, any duplicate explanation may be omitted.

Referring to FIG. 5, the color filters may include a first color filter CF1 and a second color filter CF2. The first color filter CF1 and the second color filter CF2 may be spaced apart from each other, and may be surrounded by the color-adjusting pattern CP. For example, the first color filter CF1 may be in a first light-emitting area EA1, and the second color filter CF2 may be in a second light-emitting area EA2.

The first light-emitting area EA1 may overlap a first organic light-emitting diode OLED1 including a first organic light-emitting layer OL1 along the first direction D1. Light generated by the first organic light-emitting diode OLED1 may exit through the first light-emitting area EA1 outwardly. The second light-emitting area EA2 may overlap a second organic light-emitting diode OLED2 including a second organic light-emitting layer OL2 along the first direction D1. Light generated by the second organic light-emitting diode OLED2 may exit through the second light-emitting area EA2 outwardly.

The first color filter CF1 and the second color filter CF2 may have colors different from each other. For example, the first color filter CF1 may have a substantially same color of the light generated by the first organic light-emitting diode OLED1. The second color filter CF2 may have a substantially same color of the light generated by the second organic light-emitting diode OLED2.

For example, when the first organic light-emitting diode OLED1 generates red light, the first color filter CF1 may be a red color filter. When the second organic light-emitting diode OLED2 generates green light, the second color filter CF2 may be a green color filter.

The color filters may reduce reflection of an external light incident on the organic light-emitting display device. For example, light incident on the first light-emitting area EA1 of the organic light-emitting display device may enter into the first organic light-emitting diode OLED1 through the first color filter CF1. When the first color filter CF1 is a red color filter, the first color filter CF1 may absorb green and blue components of the incident light and may transmit a red component. The first organic light-emitting diode OLED1 generating red light may absorb the red portion of incident light.

Similarly, red and blue components of light incident on the second light-emitting area EA2 of the organic light-emitting display device may be absorbed by the second color filter CF2, and a green component of the incident light may be absorbed by the second organic light-emitting diode OLED2.

Thus, reflection of external light may be reduced in the light-emitting area, which has a reflective property different from the external member. As a result, visibility of the organic light-emitting display device is reduced, and color similarity to the external member may be increased. For example, a color filter composition including a coloring agent may be coated to from a coating layer, and the coating layer may be exposed to a light and developed to form the color filter.

Figure 6:
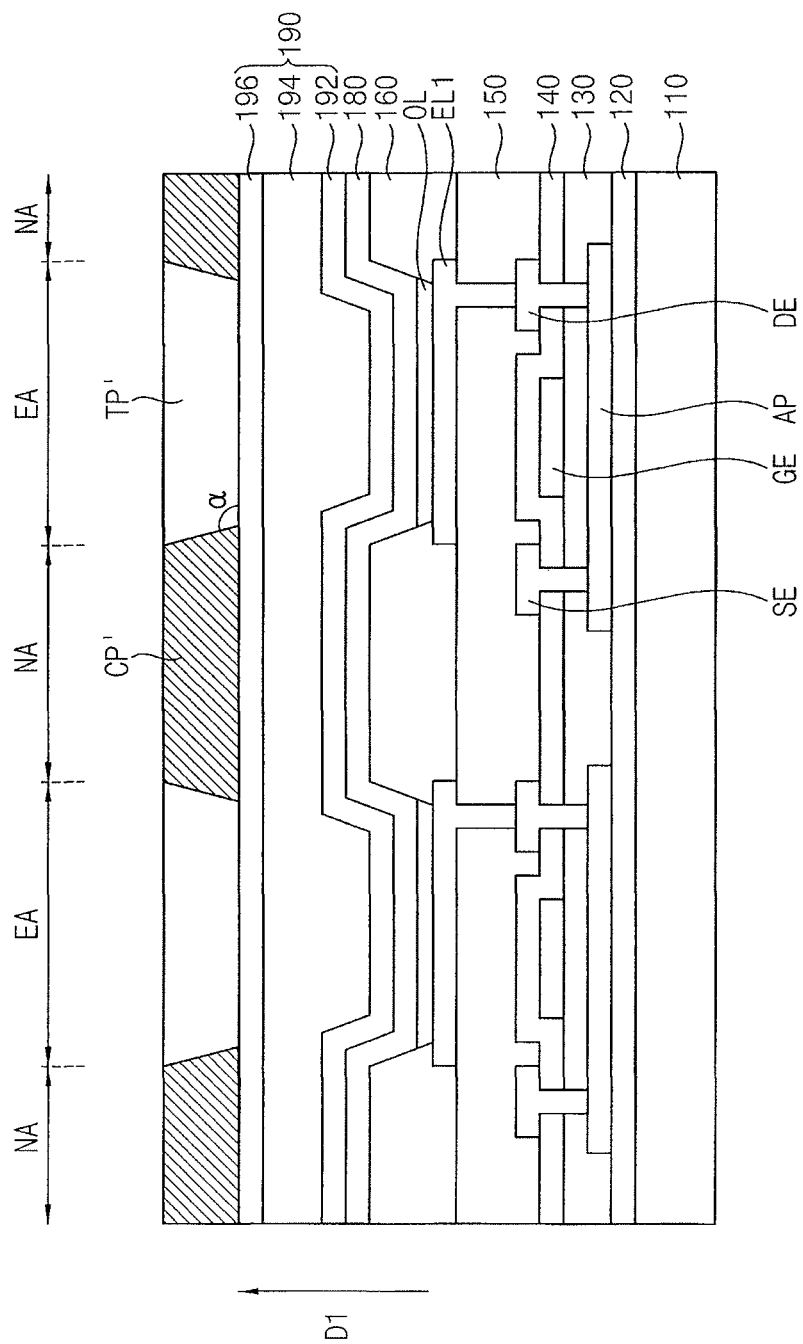
FIG. 6 illustrates an enlarged cross-sectional view of an organic light-emitting display device according to an exemplary embodiment.

FIG. 6 is an enlarged cross-sectional view illustrating an organic light-emitting display device according to an exemplary embodiment. Referring to FIG. 6, an organic light-emitting display device includes the pixel circuit array, the organic light-emitting diode electrically connected to the pixel circuit array, the thin film encapsulation layer 190 covering the organic light-emitting diode, a transmission pattern TP' in the light-emitting area EA on the thin film encapsulation layer 190, and a color-adjusting pattern CP' in the non-light-emitting area NA on the thin film encapsulation layer 190.

In an exemplary embodiment, the color-adjusting pattern CP' may have a tapered shape. The transmission pattern TP' may have an inverse-tapered shape to be aligned with the color-adjusting pattern CP'. Thus, a side surface of the color-adjusting pattern CP' and a side surface of the transmission pattern TP' may surface-contact each other.

Since the color-adjusting pattern CP' include ceramic particles, the color-adjusting pattern CP' may have a reflectivity larger than the transmission pattern TP'. Thus, when light entering into the transmission pattern TP' from the organic light-emitting display device is incident on the side surface of the color-adjusting pattern CP', the light may be total-reflected to exit outwardly. Thus, when the color-adjusting pattern CP' has a tapered shape, exiting light may be condensed by adjusting a taper angle $\alpha$ of the color-adjusting pattern CP'. For example, the taper angle $\alpha$ of the color-adjusting pattern CP' may be at least 30 degrees and less than 90 degrees.

Figure 7:
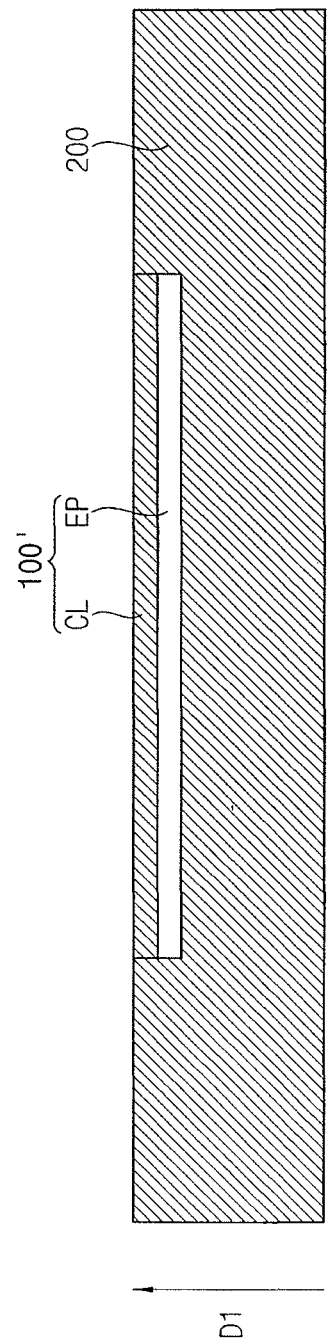
FIG. 7 illustrates a cross-sectional view of an organic light-emitting display device according to an exemplary embodiment and an external member combined therewith.
Figure 8:
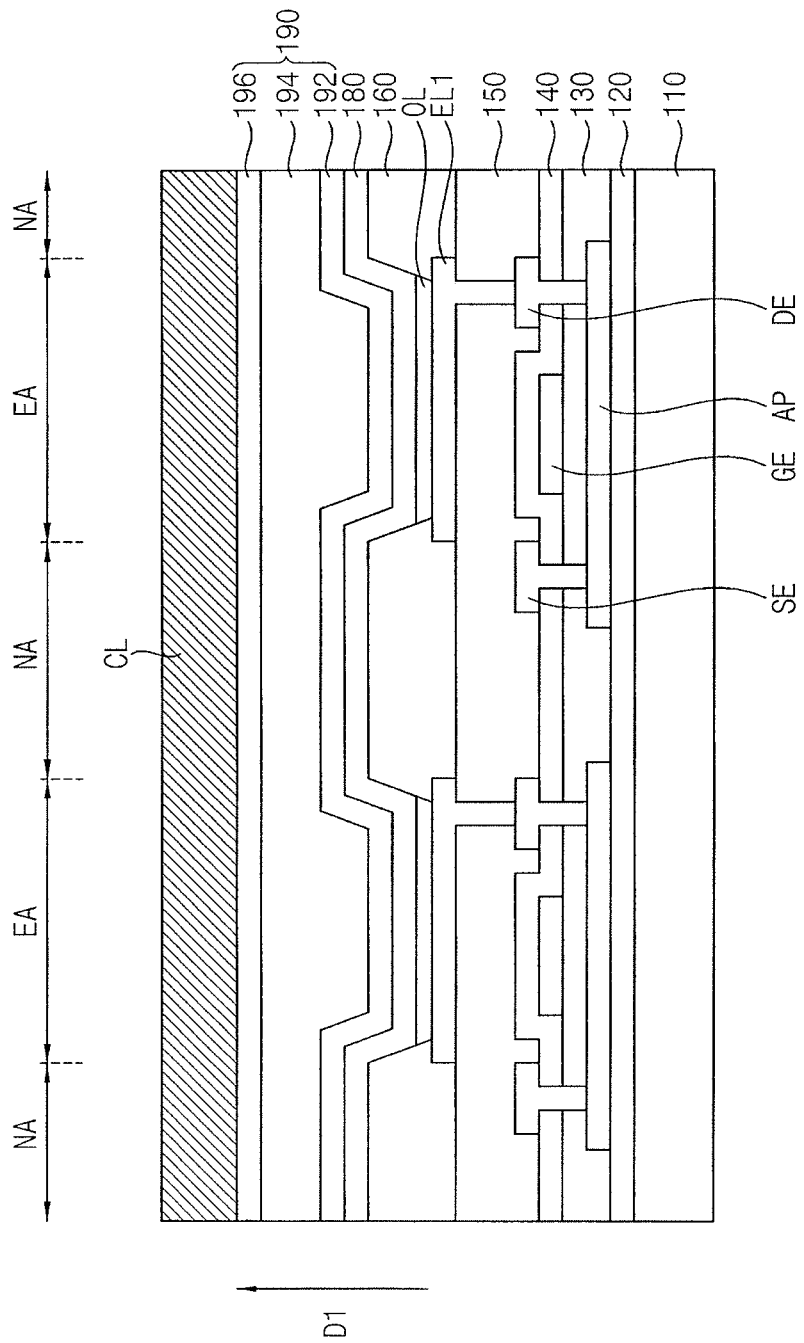
FIGS. 8 and 9 illustrate enlarged cross-sectional views of an organic light-emitting display device according to an exemplary embodiment.
Figure 9:
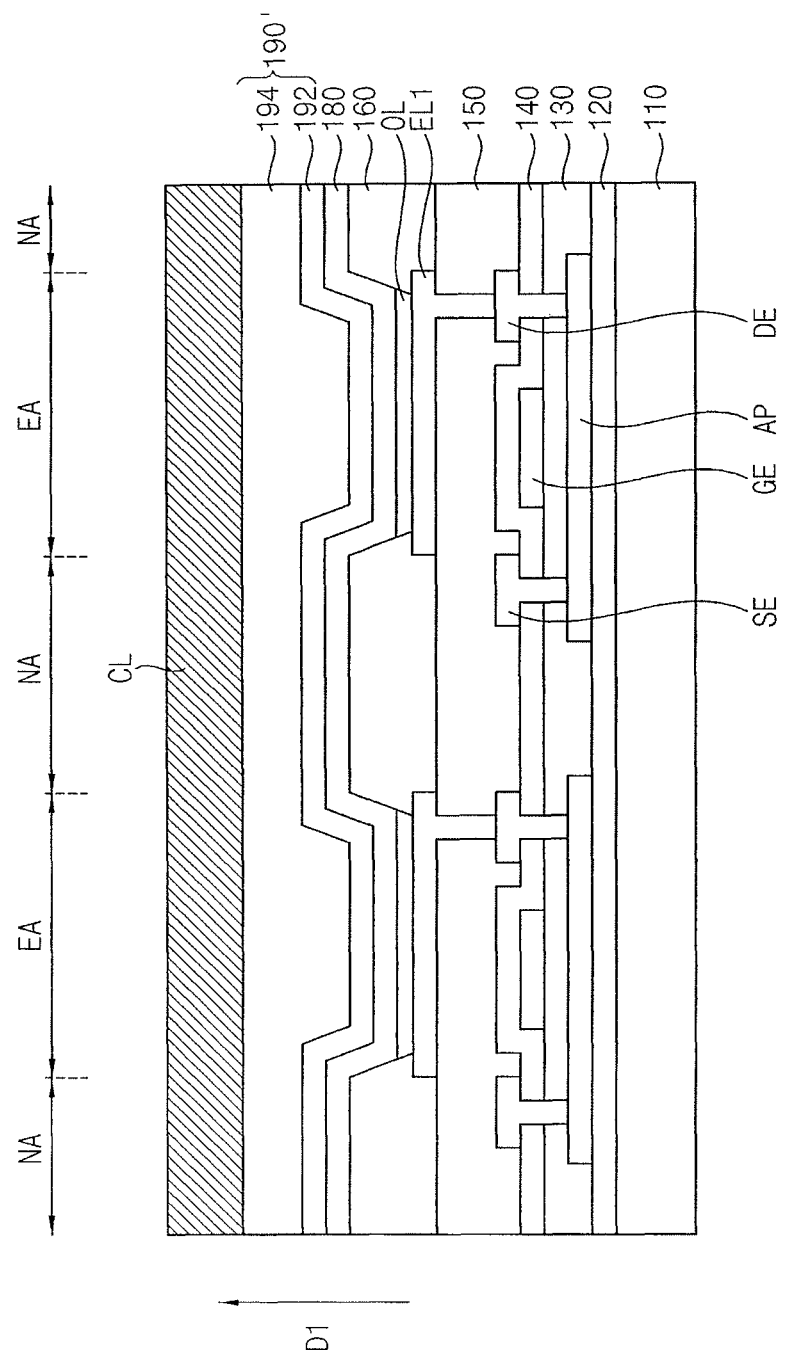

FIG. 7 is a cross-sectional view illustrating an organic light-emitting display device according to an exemplary embodiment and an external member combined therewith. FIGS. 8 and 9 are enlarged cross-sectional views illustrating an organic light-emitting display device according to an exemplary embodiment.

Referring to FIGS. 7 and 8, an organic light-emitting display device 100' may be combined with the external member 200. For example, the organic light-emitting display device 100' may be inserted into the external member 200 such that an upper surface of the external member 200 and an upper surface of the organic light-emitting display device 100 form a substantially continuous surface.

The organic light-emitting display device 100 includes the light-emitting part EP. The light-emitting part EP generates light to display an image. A color-adjusting layer CL is on the light-emitting part EP.

The color-adjusting layer CL may be on a thin film encapsulation layer 190 covering an organic light-emitting diode. The organic light-emitting display device 100' does not include a transmission pattern, and includes the color-adjusting layer CL covering both a light-emitting area EA and a non-light-emitting area NA.

The color-adjusting layer CL may have a semi-transparent property. A light generated by the light-emitting part EP may exit outwardly through the color-adjusting layer CL. Thus, an external user may perceive an image displayed by the organic light-emitting display device 100'.

In an exemplary embodiment, the color-adjusting layer CL may have a substantially same color as the surface of the external member 200. Thus, when the organic light-emitting display device 100' does not generate an image, the organic light-emitting display device 100' may be perceived as a portion of the external member 200, or a low visibility. Thus, displaying function may be introduced into the external member 200 without deteriorating aesthetic sensibility or decorative function of the external member 200.

The color-adjusting layer CL may include ceramic particles as a coloring agent. In an exemplary embodiment, the color-adjusting layer CL having a semi-transparent property may be formed by adjusting contents and combination of the ceramic particles.

In an exemplary embodiment, as illustrated in FIG. 9, the color-adjusting layer CL may be formed directly on the organic layer 194 of a thin film encapsulation layer 190'. Since the color-adjusting layer CL includes ceramic particles, the color-adjusting layer CL may functionally substitute for or compensate for the inorganic layer 196.

Exemplary embodiments may be applied to various display devices that may be used for a computer, a notebook computer, a smart phone, a smart pad, a PDA, an MP3 player, an automobile, a home appliance, a furniture or the like, and may be effectively applied to an article having decorative function or aesthetic sensibility such as a home appliance, a furniture or the like. Exemplary embodiments provide an organic light-emitting display device capable of easily providing decorative function, e.g., blending into a surrounding non-display device when not in use.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting display device, comprising:
an array of organic light-emitting diodes;
transmission patterns spaced apart from each other and disposed in a light-emitting area overlapping the organic light-emitting diodes in a plan view to emit a light generated by the organic light-emitting diodes; and
a color-adjusting pattern including ceramic particles as a coloring agent having a matrix shape surrounding the transmission patterns in a plan view so that an external light reflected by the color-adjusting pattern has a color depending on the ceramic particles,
wherein the transmission patterns have a same reflectivity as the color-adjusting pattern.

2. The organic light-emitting display device as claimed in claim 1, wherein the transmission patterns include a polymeric resin.

3. The organic light-emitting display device as claimed in claim 1, wherein the ceramic particles include at least one of $Pb_2Sb_2O_7$, $Co_2SiO_4$, $CoAl_2O_4$, $(Co, Ni, Fe, Cr, Mn)_3O_4$, $(Sn, Cr)O_2$, $(Cr, Al)_2O_3$, $Ca_3Cr_2Si_3O_{12}$, $Ca(Sn, Cr)SiO_5$, $Cd(S, Se)$, $(Ti, Cr, Sb)O_2$, $(Ti, Cr, W)O_2$, $(Zr, Pr)SiO_4$, $(Zr, V)(Si, V)O_4$, $F_2O_3$—$Zr\ SiO_4$, $(Zr, V)O_2$, $(Ce, Pr)O_2$ and $Y(Al, Cr)O_2$.

4. The organic light-emitting display device as claimed in claim 1, wherein the organic light-emitting display device is inserted into an external member and the color-adjusting pattern has a same color as an exposed surface of the external member.

5. The organic light-emitting display device as claimed in claim 1, wherein the transmission patterns include a color filter.

6. The organic light-emitting display device as claimed in claim 5, wherein:
the transmission patterns include a first color filter in a first light-emitting area, and a second color filter in a second light-emitting area, and
the first color filter and second color filter have different colors from each other.

7. The organic light-emitting display device as claimed in claim 1, wherein the transmission patterns further include a dye or a carbon black to reduce reflectivity thereof.

8. The organic light-emitting display device as claimed in claim 1, wherein the color-adjusting pattern has a tapered shape and the transmission patterns have an inversely-tapered pattern to be aligned with the color-adjusting pattern.

9. The organic light-emitting display device as claimed in claim 1, wherein an area of the color-adjusting pattern is larger than an area of the transmission patterns, in a plan view.

10. The organic light-emitting display device as claimed in claim 1, wherein the transmission patterns and the color-adjusting pattern are disposed on a same surface so that the transmission patters are adjacent to the color-adjusting pattern in a horizontal direction.

11. An organic light-emitting display device, comprising:
an array of organic light-emitting diodes;
transmission patterns spaced apart from each other and disposed in a light-emitting area overlapping the organic light-emitting diodes in a plan view to emit a light generated by the organic light-emitting diodes; and
a color-adjusting pattern including ceramic particles as a coloring agent having a matrix shape surrounding the transmission patterns in a plan view so that an external light reflected by the color-adjusting pattern has a color depending on the ceramic particles, wherein
the transmission patterns include a color filter, and
the color filter has a same color as light generated by the organic light-emitting diodes.

* * * * *